United States Patent [19]

Douglas et al.

[11] Patent Number: 4,700,350
[45] Date of Patent: Oct. 13, 1987

[54] MULTIPLE PHASE CRC GENERATOR

[76] Inventors: Phillip N. Douglas, 2409 Doran Pl.;
Alan G. Johnson, 3005 Beane Dr.,
both of Raleigh, N.C. 27604

[21] Appl. No.: 871,818

[22] Filed: Oct. 7, 1986

[51] Int. Cl.$^4$ ............................................. G06F 11/10
[52] U.S. Cl. ..................................... 371/37; 307/269;
307/480; 328/109
[58] Field of Search ........................ 371/43, 47, 53, 37;
375/110, 116; 377/104, 47, 106; 307/269, 480,
262, 479, 527, 528, 511, 518, 271; 328/62, 63,
72, 109, 133; 370/105; 364/604, 825

[56] References Cited

U.S. PATENT DOCUMENTS

| | | | |
|---|---|---|---|
| 4,105,999 | 8/1978 | Nakamura | 371/37 |
| 4,316,284 | 2/1982 | Howson | 370/105 |
| 4,316,285 | 2/1982 | Bobilin et al. | 370/105 |
| 4,454,600 | 6/1984 | LeGresley | 371/25 |
| 4,593,393 | 6/1986 | Mead et al. | 371/37 |

OTHER PUBLICATIONS

"32-Bit CRC (Cyclical Redundancy Checking) Error Detection", Copyright 1978, Monolithic Memories Programmable Logic Handbook, Fourth Edition.

Primary Examiner—Stanley D. Miller
Assistant Examiner—Richard Roseen
Attorney, Agent, or Firm—Head & Johnson

[57] ABSTRACT

A multiple phase CRC (cyclic redundancy check) generator having a clock phasing circuit having an input connected to the CRC clock source and a plurality of N phase clock outputs, and a plurality of N CRC circuits each having a data input, and a phase clock input each connected to one of the clock phasing circuit phase clock outputs, and each having a cyclic redundancy check output. The clock phasing circuit preferably is formed of a sequence of divided-by-two circuits each having an input and two outputs; there being N−1 divider circuits arranged in log$_2$N tiers, the divider circuits of the first tier having its input connected to the clock output and the outputs of the last tier of divider circuits each being connected to separate clock inputs of the CRC circuits.

3 Claims, 5 Drawing Figures

MULTIPLE PHASE CRC GENERATOR

SUMMARY OF THE INVENTION

The present invention has, for its primary object, the provision of a circuit to overcome the inherent clock speed limitations of normal cyclic redundancy check (CRC) generators. Most normal cyclic redundancy generators are limited to 40 megahertz or less except when exotic devices such as galium arsenide or emitter coupled logic circuits are used. The present invention overcomes the need for employing such exotic devices or emitter coupled logic circuits.

Basically, the multiphase CRC generator of this disclosure operates by splitting the original clock into N clocks each having a period of N times the original clock. Each of the clocks synchronizes its own separate CRC generator. This operation produces N CRC's for each data stream that is converted. In turn, these N CRC's can be combined with hardware or software to form a composite CRC or they can be used to represent the original data stream.

As an example, if the data stream to be converted is clocked at 100 megahertz and 25 megahertz CRC generators are to be used, a 4 element multiple phase CRC generator of the present invention would be used to produce four unique CRC's. The CRD's are then capable of being combined or used to uniquely identify the data stream that was converted.

The present invention is useful in all applications requiring that error detection be performed on high speed (greater than 40 megahertz) serial data streams.

The invention consists essentially of a CRC clock source producing a sequence of clock pulses. A clock phasing circuit is employed having an input connected to the CRC clock source and a plurality of N phased clock outputs.

A plurality of N CRC circuits are used each having a data input, and a phased clock input each connected to one of the clock phasing circuits phased clock outputs, and each has a cyclic redundancy check output.

In the preferred practice of the invention the clock phasing circuit is formed of a sequence of divide-by-two circuits each of which has an input and two outputs. N−1 divider circuits ae used and are arranged in log$_2$N tiers. The divider circuit of the first tier has its first input connected to the clock output. The output of the last tier of divider circuits are connected to separate of the CRC circuits.

The invention will be better understood by reference to the following description and claims, taken in conjunction with the attached drawing.

DETAILED DESCRIPTION OF THE PREFERRED EMBODIMENT

Figure 1:
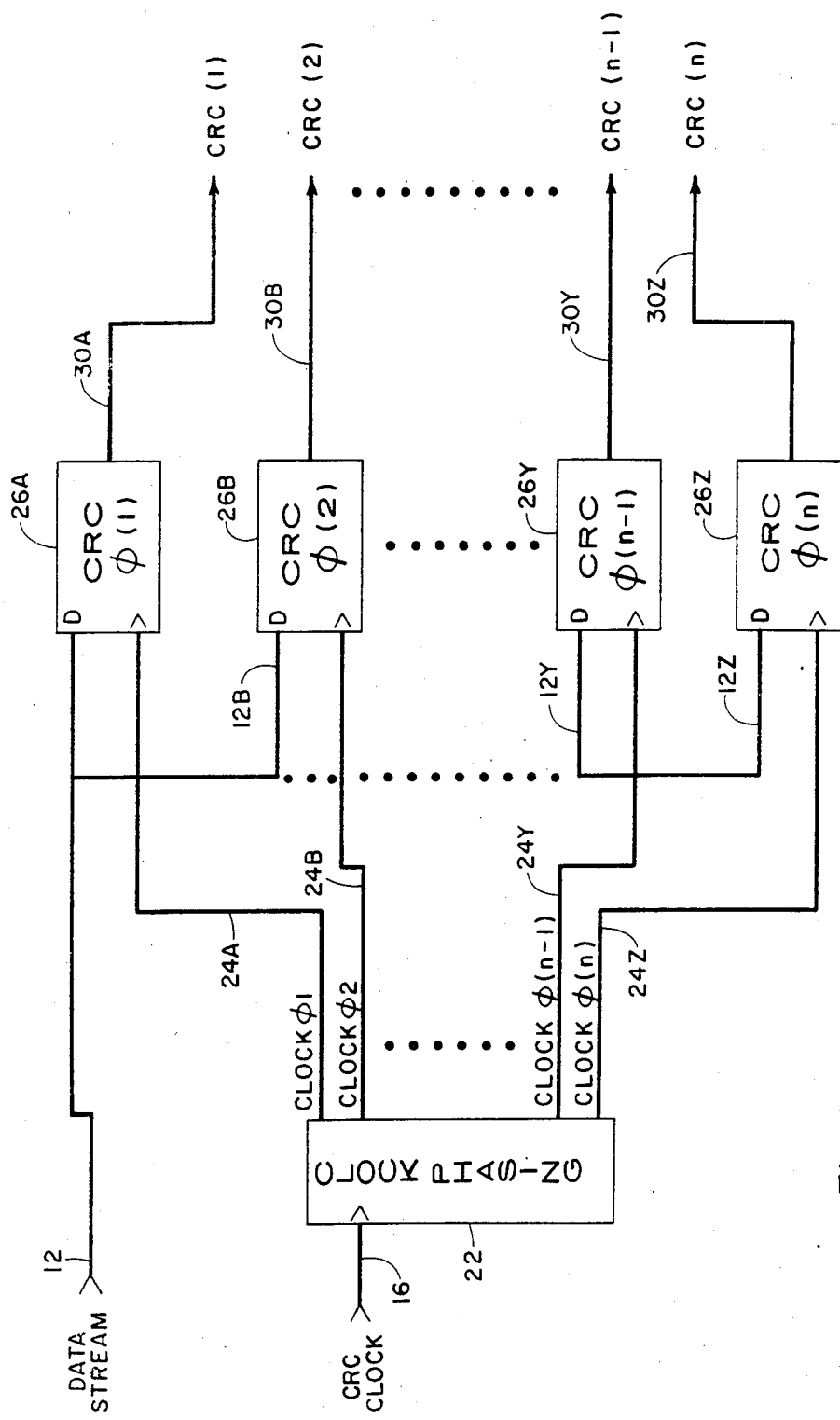
FIG. 1 is a block diagram of a multiple phase CRC generator showing one arrangement for practicing the present invention.

Referring to the drawings and first to FIG. 1, a block diagram of one embodiment of a multiple phase CRC generator of this invention is shown. A data stream input is provided by conductor 12. A CRC (cyclic redundancy check) clock signal is provided at conductor 16, which typically will be of the type producing a clock frequency of 40 megahertz or more. The CRC clock signal is fed by conductor 16 to a clock phasing circuit 22.

The clock phasing circuit functions to split the original clock signal from conductor 16 into N clock outputs, thereby providing at the output of the clock phasing circuit 22 output conductors 24A, 24B, 24Y and 24Z representing N clocks, each having a period of N times the period of the CRC clock signal on conductor 16. Each of the clock outputs of the clock phasing circuit 22 is fed to its own CRC generator indicated by 26A, 26B, 26Y and 26Z, there being N such CRC generators. The data stream on conductor 12 is fed to the first CRC generator 26A and by conductors 12B, 12Y and 12Z to CRC generators 26B, 26Y and 26Z, respectively. Each of the CRC generators provide on conductors 30A, 30B, 30Y and 30Z a cyclic redundancy checks signal.

As previously indicated the function of the clock phasing circuit 22 is to split the original clock signal into N clock signals each having a period of N times the original clock period.

Figure 2:
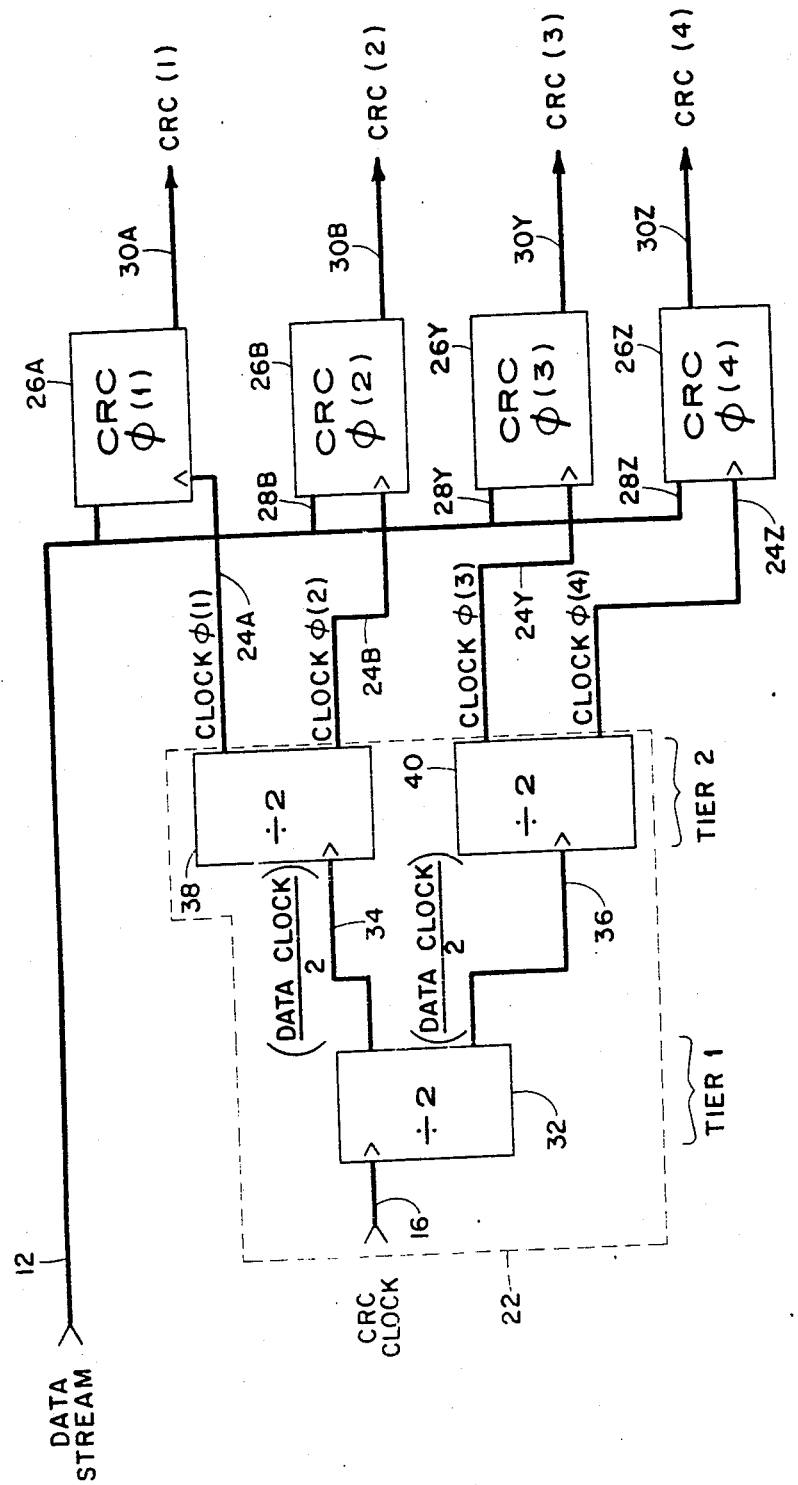
FIG. 2 is a block diagram of a multiple phase CRC generator of the arrangement of FIG. 1 employing four elements and having four separate CRC circuits.

FIG. 2 shows an embodiment of the circuit of FIG. 1 in which the clock phasing circuit 22 is arranged to provide four clock outputs. In this diagram the clock phasing circuit 22 is formed by cascading divided-by-two circuits arranged in tiers. Two tiers of divide-by-two circuits are employed. Tier 1 has a single divide-by-two circuit 32. The input to the divide-by-two circuit is the CRC clock signal on conductor 16. The output is a data clock signal on conductor 34 and a similar but inverted separate clock signal on conductor 36, the signal on each of these conductors having a period of the signal from CRC clock 16 multiplied by two. The second tier consists of divide-by-two circuits 38 and 40. Circuit 38 provides an output on conductor 24A having a period of twice that appearing on conductor 34. The same is true of the signal on conductor 24B which is inverted. The output of divide-by-two circuit 40 provides clock signal outputs each having a period of twice that of the input signal period, these signals appearing on conductors 24Y and 24Z. The conductor 24A, 24B, 24Y and 24Z each feed separate CRC circuits 26A, 26B, 26Y and 26Z as described with reference to FIG. 1.

If it was desirable to provide a clock phasing circuit having eight clock outputs then a third tier of divide-by-two circuits would be employed, consisting of four such circuits. One of such circuits would receive input from conductor 24A, another from conductor 24B, another from conductor 24Y, and the last from conductor 24Z. Thus, for N clock signal outputs there will be log$_2$N tiers and a total of N−1 divided by two circuits.

Figure 3:
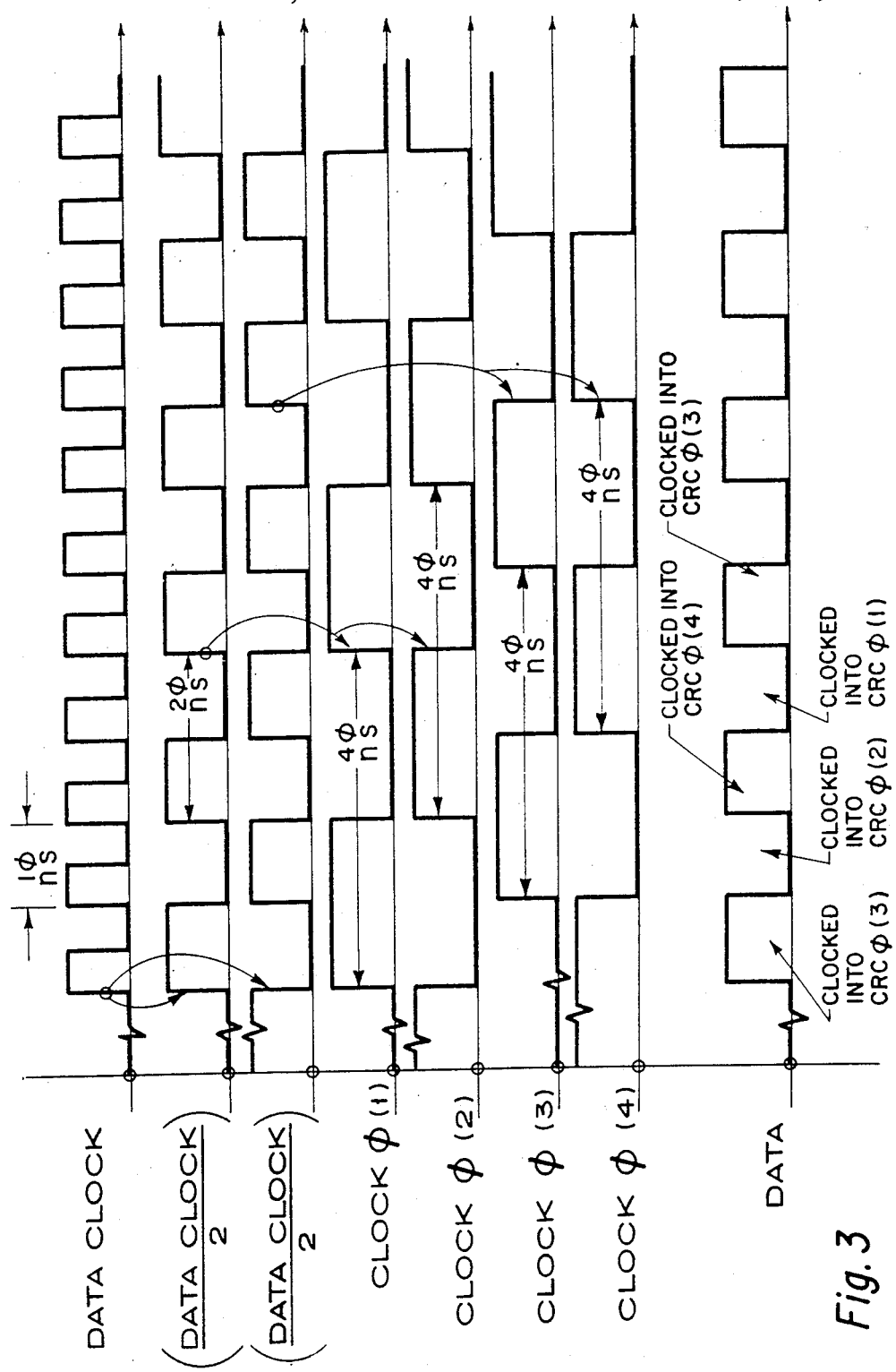
FIG. 3 is a timing diagram of the four element multiple phase CRC generator of FIG. 2.

FIG. 3 shows the timing diagram for the four element multiple phase CRC generator of FIG. 2.

The invention thus provides a circuit arrangement in which a N number of CRC's are available for each data stream that is converted. In turn these CRC's can be combined with hardware (not shown) or software to form a composite CRC or they can be used to represent the original data stream.

Regardless of the method employed in practicing the invention, the clock phasing circuitry must take the CRC clock as an input and produce N clock outputs each one having a period of N times the period of the CRC clock. In addition, each phased clock output must be offset in time by one CRC clock period from the preceding phase clock as illustrated in the timing diagram of FIG. 5. In addition, each phase clock must meet the clock requirements of the particular CRC generator chosen for the application.

Figure 4:
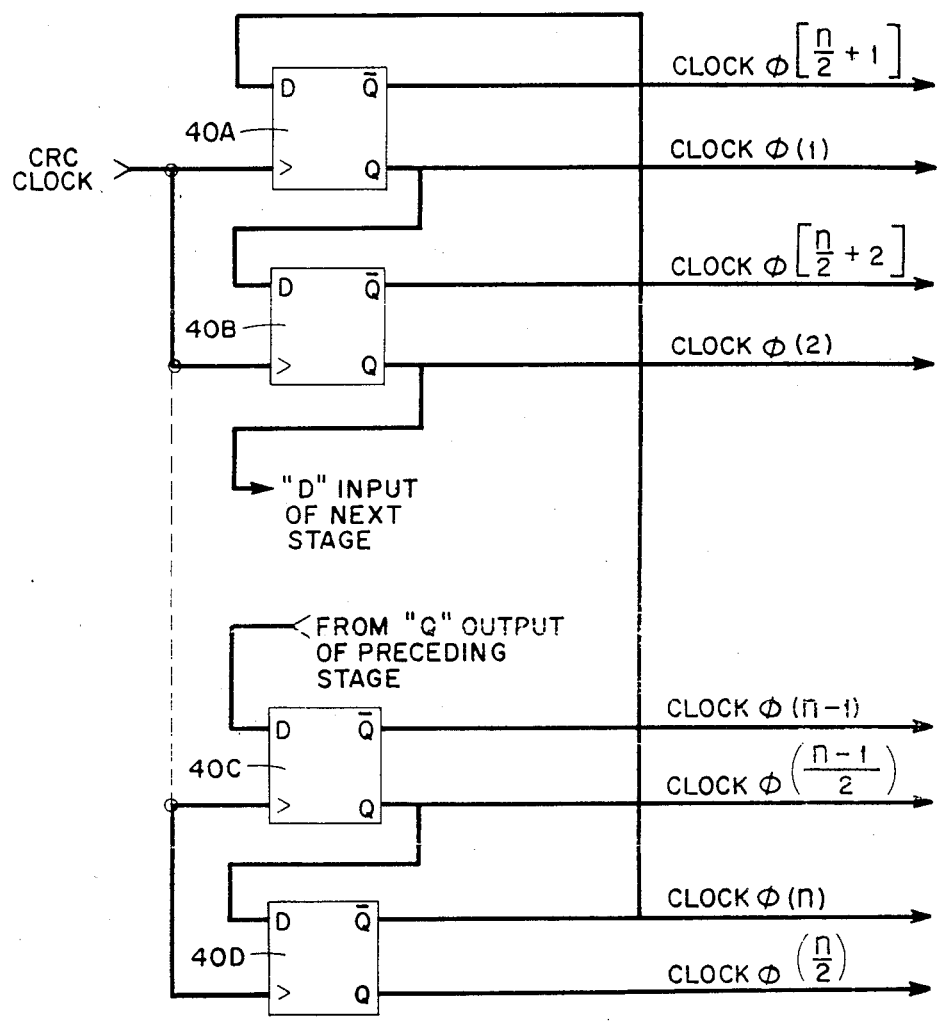
FIG. 4 is a block diagram of a circuit showing another arrangement for practicing the invention.
Figure 5:
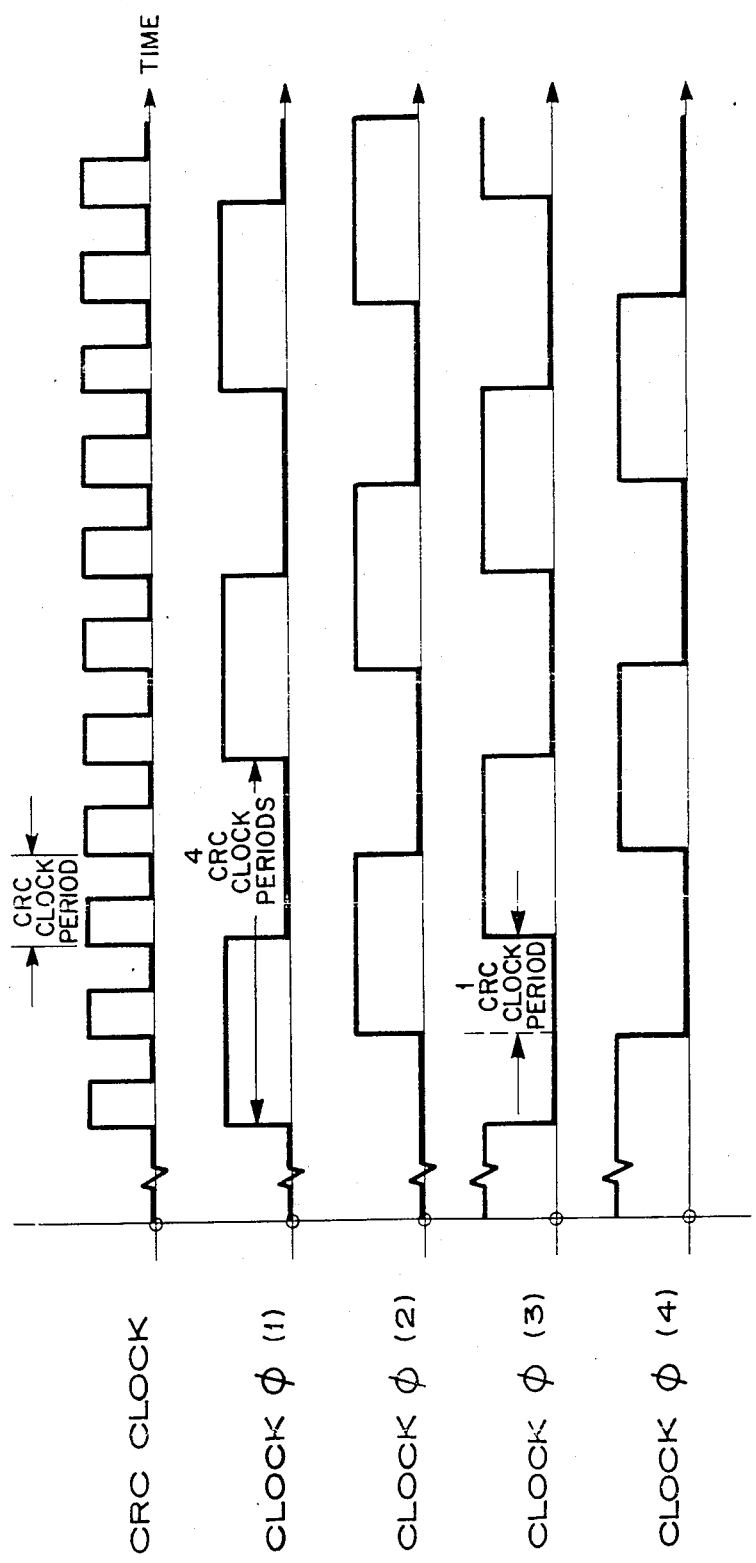
FIG. 5 is a timing diagram for the phased clock outputs of a four element multiple phase cyclic redundancy check generator of the arrangement of FIG. 4.

FIG. 4 is a block diagram of another arrangement for practicing the invention. This circuit employs N stages indicated by the numerals 40A, 40B, 40C and 40D. Prior to start of operation all stages are cleared so that all Q outputs are low and all $\bar{Q}$ outputs are high. The number of stages is N/2. FIG. 5 shows the timing relationships for the circuit of FIG. 4 for a four element multiple phase CRC generator.

While the invention has been described with a certain degree of particularity it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

What is claimed is:

1. A multiple phase cyclic redundancy check (CRC) generator comprising:
    a source providing a sequence of clock pulses;
    a data stream source;
    a clock phasing circuit having an input connected to said source of clock pulses and a plurality of N phased clock outputs; and
    a plurality of N CRC circuits each having a data input connected to said data stream source, and a phased clock input each connected to one of said clock phasing circuit phased clock outputs, and each having a cyclic redundancy check output.

2. A multiple phase CRC circuit according to claim 1 wherein said clock phasing circuit comprises a sequence of divide-by-two circuits each having an input and two outputs, there being $N-1$ divider circuits arranged in $\log_2 N$ tiers, the divider circuit of the first tier having its input connected to said source of clock pulses, and the outputs of the last tier of divider circuits each being connected to a different one of said CRC circuits phased clock input.

3. A multiple phase CRC circuit according to claim 1 wherein said clock phasing circuit provides N phased clock outputs each having a period of N times a CRC clock period, and each being offset in time by one CRC clock period from the preceding phase clock.

* * * * *